United States Patent [19]

Ohme

[11] Patent Number: 4,569,050

[45] Date of Patent: Feb. 4, 1986

[54] DATA COMMUNICATION SYSTEM WITH FIXED WEIGHT ERROR CORRECTION AND DETECTION CODE

[75] Inventor: Bruce W. Ohme, Minneapolis, Minn.

[73] Assignee: Honeywell Inc., Minneapolis, Minn.

[21] Appl. No.: 457,986

[22] Filed: Jan. 14, 1983

[51] Int. Cl.$^4$ ............................................. G06F 11/10
[52] U.S. Cl. ........................................ 371/37; 371/39; 371/40
[58] Field of Search ................... 371/52, 37, 38, 39, 371/40

[56] References Cited

U.S. PATENT DOCUMENTS

| | | | |
|---|---|---|---|
| 3,381,271 | 4/1968 | Duuren | 371/52 |
| 3,439,327 | 4/1969 | Sourgens | 371/52 |
| 4,134,103 | 1/1979 | Huxtable et al. | 371/52 |
| 4,313,105 | 1/1982 | Anamthan | 371/52 |
| 4,334,309 | 1/1982 | Bannon et al. | 371/37 |
| 4,397,022 | 8/1983 | Weng et al. | 371/37 |
| 4,414,666 | 11/1983 | Nelson | 371/37 |

Primary Examiner—Michael R. Fleming
Attorney, Agent, or Firm—Theodore F. Neils; David R. Fairbairn

[57] ABSTRACT

A data communication system having improved error correction and detection capabilities includes an encoder which converts each input word containing three binary message bits to an eight-bit binary code vector which contains exactly four "1's" and four "0's", and thus has a fixed "weight" of 4. In addition, the same symbol (either a "1" or "0") is consecutively repeated in the code vector no more than two times. The code vector is transmitted from a transmitter to a receiver, and the eight-bit received vector is decoded by a decoder to produce an output word containing three message bits. The decoder detects errors in received vectors by checking the weight of the received vector, by checking syndrome based upon predetermined combinations of bits of the received vector, and by performing a parity check on two selected bits of the received vector which should be unequal. Based upon the weight, syndrome and parity checks, the decoder determines the presence of all single and double errors and detects the presence of most high multiple errors in the received vector. In some embodiments, the decoder also corrects the single errors which have been detected, so that the output word can be produced accurately despite the occurrence of single errors in the received vector.

62 Claims, 4 Drawing Figures

FIG. 4

DATA COMMUNICATION SYSTEM WITH FIXED WEIGHT ERROR CORRECTION AND DETECTION CODE

BACKGROUND OF THE INVENTION

1. Field of the Invention

The present invention relates to systems and methods of encoding and decoding digital data which is being transmitted in order to reduce the likelihood of errors in the received digital data caused, for example, by noise associated with the transmission of the data.

2. Description of the Prior Art

The transmission of data between two locations presents the danger that the data will be corrupted by noise or by malfunction of either the transmitter or the receiver. In order to reduce the likelihood of errors corrupting transmitted data, it is well-known to encode the data prior to transmission, and to decode the received signals to convert those received signals back to the digital data. The encoding and decoding of the data typically involves adding check bits which allow the decoder to detect the presence of errors in the received signals. In some cases, the particular code used for encoding the data permits the decoder not only to detect the presence of some transmission errors, but also to correct certain of those errors.

One such error detecting and correcting code is the (8, 4) single-error correcting, double-error detecting Hamming code. The Hamming code involves the generation of an eight-bit code vector from four information or message bits by adding four check bits. The code vectors have a minimum Hamming distance of 4. This means that all code vectors have a weight of either 0, 4 or 8. As used in this context, "weight" is defined as the total number of "1's" present in the code vector. In the Hamming code, there is one eight-bit code vector possible with a weight of 0, one code vector possible with a weight of 8, and all other possible code vectors have a weight of 4. All of the Hamming code vectors satisfy the matrix product $gH^t = 0$, where g is a code vector, where H is the check matrix of the Hamming (8, 4) code, and where addition is modulo 2. The check matrix of the (8, 4) Hamming code is $$H = \begin{bmatrix} 0 & 0 & 0 & 0 & 1 & 1 & 1 & 1 \\ 0 & 0 & 1 & 1 & 0 & 0 & 1 & 1 \\ 0 & 1 & 0 & 1 & 0 & 1 & 0 & 1 \\ 1 & 1 & 1 & 1 & 1 & 1 & 1 & 1 \end{bmatrix}.$$

Although the (8, 4) Hamming code allows the decoder to correct all single errors and to detect all double errors in the received code vector, the decoder cannot detect errors of multiplicity greater than 2. As a result, long bursts of errors caused by noise or by malfunctions of either the transmitter or the receiver may not be detected using the (8, 4) Hamming code.

There is a continuing need for improved codes to be used in encoding and decoding transmitted data which have a relatively high ratio of information bits to check bits, and yet provide improved error correction and error detection capabilities.

SUMMARY OF THE INVENTION

The present invention is an improved method and system for digital data communication which utilizes a fixed weight code. The system of the present invention includes encoder means, transmitter means, receiver means and decoder means.

The encoder means converts a three-bit input word to an eight-bit code vector. A different code vector is provided for each possible combination of the three message bits of the input word. Each different code vector has a fixed weight of binary ones "1's", which preferably is 4.

The transmitter means transmits the eight-bit code vector. The receiver means receives an eight-bit vector which is equal to the transmitted code vector if a valid data transmission has occurred.

The received code vector is converted to a three-bit output word by the decoder means. The decoder means checks the weight of the received vector. Since the weight of the transmitted code vector is fixed, the received vector should also have that fixed weight if a valid data transmission has occurred. If the weight of the received vector varies from the fixed weight, the decoder means indicates that an error exists.

The decoder means also preferably checks the syndrome of the received vector (based upon combinations of selected bits), and checks parity of a predetermined pair of bits of the received vector. The syndrome is checked by combining selected bits of the received code vector. If the value resulting from the combination of these bit varies from a predetermined value, the decoder means indicates that the received vector contains an error.

The parity check involves comparing the value of two bits of the received vector which are known to be unequal if the received vector is correct. In preferred embodiments, the two bits which are compared in the parity check are one of the message bits and a check bit which is the complement of the message bit. If the two bits are equal, the decoder means indicates the presence of an error in the received vector.

By checking the weight, syndrome and parity, the decoder means detects all single and double errors and most multiple errors which involve more than two incorrect bits. In addition, in some embodiments the decoder means corrects all single errors based upon the weight, syndrome and parity checks of the received vector.

DETAILED DESCRIPTION OF THE PREFERRED EMBODIMENTS

Figure 1:
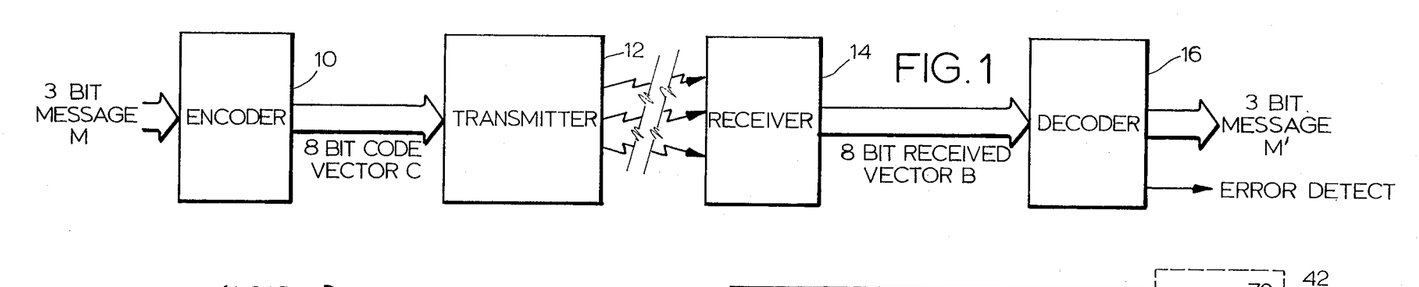
FIG. 1 is a block diagram showing a data communication system which utilizes the fixed weight error correction and detection code of the present invention.

FIG. 1 shows a data communication system in which an input data word in the form of a three-bit message M is to be transmitted to a remote location. The system includes encoder 10, transmitter 12, receiver 14, and decoder 16.

Encoder 10 converts three-bit message M to an eight-bit code vector C, which is transmitted by transmitter 12 or by any one of many well-known media (such as over transmission lines, by radio frequency or optical transmission or the like) and in any one of many well-known data transmission formats (such as phase shift keyed or frequency shift keyed formats). Receiver 14 receives the transmitted signal from transmitter 14 in the form of an eight-bit received vector B. Decoder 16 provides a three-bit message M' derived from received vector B. Decoder 16 checks predetermined characteristics of received vector B (in particular weight, syndrome and parity) to determine whether received vector B has been corrupted by noise, thus causing received vector B to differ from transmitted code vector C. If decoder 16 determines that an error exists, it provides an error detect signal.

In the present invention, encoder 10 utilizes a fixed weight code for converting three-bit message M to eight-bit code vector C. The three bits M1, M2 and M3 of message M are used by encoder 10 to generate the eight bits (C1–C8) of code vector C. Equations 1, 2 and 3a–3h show the relationship between message bits M1–M3 and code vector bits C1–C8.

$$M = M1\ M2\ M3 \qquad \text{Eq 1}$$

$$C = C1\ C2\ C3\ C4\ C5\ C6\ C7\ C8 \qquad \text{Eq 2}$$

$$C1 = M1 \qquad \text{Eq 3a}$$

$$C2 = M1 \qquad \text{Eq 3b}$$

$$C3 = M2 \qquad \text{Eq 3c}$$

$$C4 = M2 \qquad \text{Eq 3d}$$

$$C5 = M3 \qquad \text{Eq 3e}$$

$$C6 = M3 \qquad \text{Eq 3f}$$

$$C7 = (M2 \oplus M3) \oplus M1 \qquad \text{Eq 3g}$$

$$C8 = (M2 \oplus M3) \oplus M1 \qquad \text{Eq 3h}$$

Table 1 shows the code vector C generated for each possible combination of message bits M1, M2 and M3.

TABLE 1

| MESSAGE M | | | CODE VECTOR C | | | | | | | |
|---|---|---|---|---|---|---|---|---|---|---|
| M1 | M2 | M3 | C1 | C2 | C3 | C4 | C5 | C6 | C7 | C8 |
| 0 | 0 | 0 | 0 | 1 | 1 | 0 | 0 | 1 | 1 | 0 |
| 0 | 0 | 1 | 0 | 1 | 1 | 0 | 1 | 0 | 0 | 1 |
| 0 | 1 | 0 | 0 | 1 | 0 | 1 | 0 | 1 | 0 | 1 |
| 0 | 1 | 1 | 0 | 1 | 0 | 1 | 1 | 0 | 1 | 0 |
| 1 | 0 | 0 | 1 | 0 | 1 | 0 | 0 | 1 | 0 | 1 |
| 1 | 0 | 1 | 1 | 0 | 1 | 0 | 1 | 0 | 1 | 0 |
| 1 | 1 | 0 | 1 | 0 | 0 | 1 | 0 | 1 | 1 | 0 |
| 1 | 1 | 1 | 1 | 0 | 0 | 1 | 1 | 0 | 0 | 1 |

An inspection of Table 1 reveals several important properties shared by all eight possible code vectors.

First, all code vectors contain exactly four "1's" and four "0's". In other words, all code vectors have a weight of 4, where "weight" is defined as the total number of "1's" in the code vector.

Second, no code vector has the same symbol (i.e. either a "1" or "0") consecutively repeated more than two times. In addition, no two code vectors in succession will result in the same symbol being consecutively repeated more than twice. As a result, in no string of code vectors will there be more than two adjacent "1's" or two adjacent "0's".

Third, all code vectors contain all three message bits in both true and complement form.

Fourth, if the code bits are taken in the order shown and grouped in pairs, each two-bit group consists of a "1" and a "0".

Fifth, all code vectors satisfy the matrix product $CH^t = 0$, where C is the code vector, H is the check matrix used in the Hamming (8, 4) code and addition is modulo 2. This is an equivalent statement of the following relationship which is true for all code vectors:

$$C5 \oplus C6 \oplus C7 \oplus C8 = 0 \qquad \text{Eq 4a}$$

$$C3 \oplus C4 \oplus C7 \oplus C8 = 0 \qquad \text{Eq 4b}$$

$$C2 \oplus C4 \oplus C6 \oplus C8 = 0 \qquad \text{Eq 4c}$$

$$C1 \oplus C2 \oplus C3 \oplus C4 \oplus C5 \oplus C6 \oplus C7 \oplus C8 = 0 \qquad \text{Eq 4d}$$

Sixth, for all code vectors the following relationship holds:

$$C1 \oplus C2 = 1 \qquad \text{Eq. 5}$$

Receiver 14 provides an eight-bit received vector B to decoder 16. Vector B contains eight bits B1–B8 which will correspond to bits C1–C8 of code vector C if the data transmission from transmitter 12 to receiver 14 has occurred without an error.

For each received vector B, decoder 16 checks three conditions to determine whether an error is present. First, decoder 16 checks the weight of received vector B. Since all possible code vectors C have a fixed weight of 4, received vector B must also have a weight of 4.

Second, decoder 16 calculates a three-bit syndrome vector S where $$S = S3\ S2\ S1 \qquad \text{Eq 6}$$

$$S3 = B5 \oplus B6 \oplus B7 \oplus B8 \qquad \text{Eq 7a}$$

$$S2 = B3 \oplus B4 \oplus B7 \oplus B8 \qquad \text{Eq 7b}$$

$$S1 = B2 \oplus B4 \oplus B6 \oplus B8 \qquad \text{Eq 7c}$$

By comparing Equations 7a–7c with Equations 4a–4c, it can be seen that if received vector B is identical to code vector C, than S3, S2 and S1 all should be "0". If syndrome S is not equal to 000, then received vector B contains an error.

Third, decoder 16 compares bits B1 and B2. If bits B1 and B2 correspond to bits C1 and C2 of the code vector, then bits B1 and B2 should not be equal. In other words:

$$PC = B1 \oplus B2 = 1 \qquad \text{Eq 8}$$

If the parity check (PC) indicates that bits B1 and B2 are equal (i.e. PC=0), an error is present in received vector B.

By checking weight, syndrome and parity, decoder 16 detects all single and double errors present in received vector B, as well as most multiple errors.

As will be discussed in further detail later, decoder 16 can be used simply to decode the received vector B and detect the presence of errors, or can be used to correct single errors and detect multiple errors. When decoder 16 is used for error detection only, the only undetected errors are quadruple, sextuple, or octuple errors in which the number of "1's" incorrectly received as "0's" equals the number of "0's" incorrectly received as "1's" and the result is one of the eight possible code vectors shown in Table 1. In other words, the type of communication channel noise which creates an undetected error must corrupt at least four of the eight bits of the code vector C. In addition, the noise must corrupt both "0's" and "1's" in equal proportions within the received vector B. The likelihood of this type of undetected error is, therefore, very low.

Figure 2:
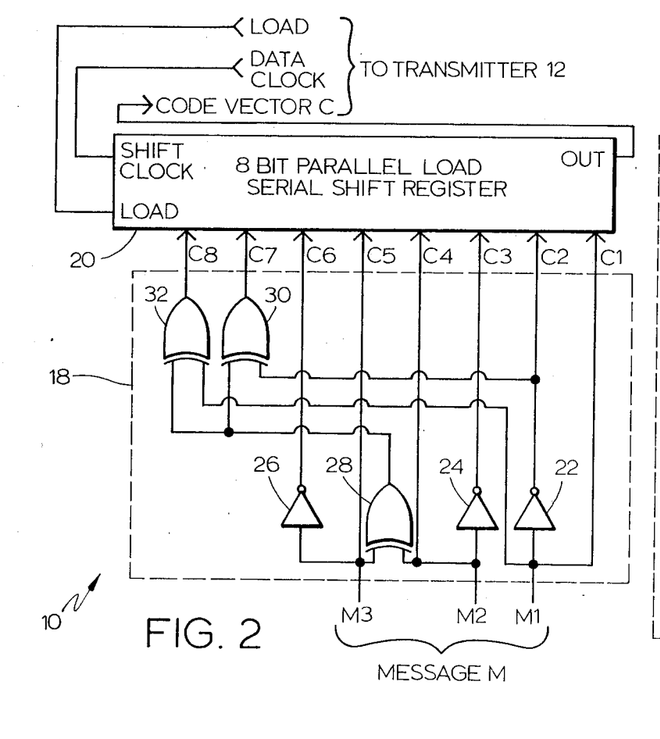
FIG. 2 shows a preferred embodiment of the encoder of the system of FIG. 1.

FIG. 2 shows encoder 10 used in one preferred embodiment of the data communication system of the present invention. In this embodiment, encoder 10 includes encoding logic 18 and shift register 20 to convert the three-bit parallel input message M to a serial output code vector C. Encoding logic 18, which includes inverters 22, 24 and 26 and exclusive OR (XOR) gates 28, 30 and 32, converts message bits M1–M3 to code vector bits C1–C8 according to the relationships set forth in Equations 3a–3h.

Shift register 20 is an eight-bit parallel load, serial output shift register which receives code vector bits C1–C8 at its inputs. When transmitter 12 supplies a LOAD pulse to shift register 20, bits C1–C8 are loaded into shift register 20. A DATA CLOCK signal is then provided by transmitter 12 to the shift clock input of shift register 20. Code vector C is shifted out of shift register 20 to transmitter 12 in serial fashion, with bit C1 being shifted out first, and bit C8 being shifted out last. In a preferred embodiment of the present invention, transmitter 12 transmits code vector C as it is received from shift register 20, with bit C1 being transmitted first and bit C8 being transmitted last.

Figure 3:
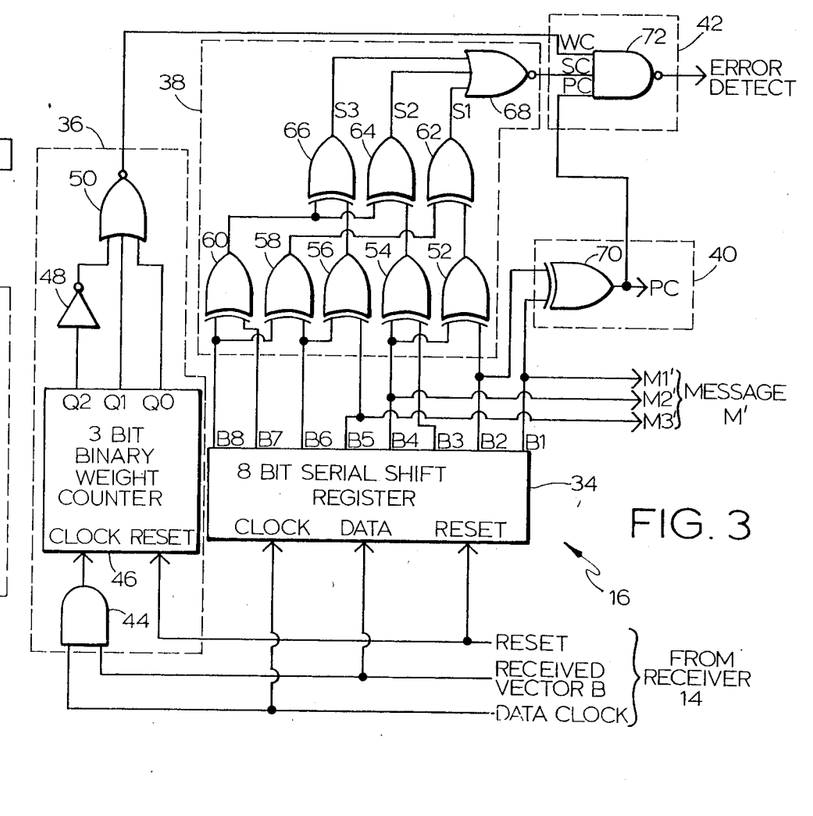
FIG. 3 shows a preferred embodiment of the decoder of the system of FIG. 1.

FIG. 3 shows one preferred embodiment of decoder 16, which includes shift register 34, weight check circuit 36, syndrome check circuit 38, parity check circuit 40, and error detect circuit 42.

As receiver 14 receives the serial data which has been transmitted by transmitter 12, it produces a serial received vector B. Bits B1–B8 of received vector B are clocked into encoder 16 by means of the DATA CLOCK signal from receiver 14. Receiver 14 also provides a RESET signal which resets decoder 16 prior to each new received vector B.

Shift register 34 is an eight-bit serial input, parallel output shift register which receives and holds the received vector B. When received vector B is fully shifted into register 34, bits B1, B4 and B5 provide message bits M1', M2' and M3', respectively, of the output message M'. If no error has occurred, bits B1, B4 and B5 correspond to bits C1, C4 and C5 of the code vector C, and therefore message bits M1', M2' and M3' correspond to message bits M1, M2 and M3, respectively.

Weight check circuit 36 includes AND gate 44, weight counter 46, inverter 48, and NOR gate 50. The incoming received vector B and the DATA CLOCK signal from receiver 14 are ANDed by AND gate 44 and provided to the clock input of weight counter 46. The output of counter 46, therefore, represents the weight of the received vector B. If received vector B has a weight of 4, the output of counter 46 is "100", which represents the binary equivalent of "4". Inverter 48 and NOR gate 50 are connected to the outputs of weight counter 46 to produce a weight check (WC) signal which is a "1" only if the weight of the received vector B is binary "100".

Syndrome check circuit 38 is connected to the outputs of shift register 34 to receive bits B2 through B8 of received vector B. Syndrome check circuit 38 includes XOR gates 52, 54, 56, 58, 60, 62, 64 and 66, which combine bits B2 through B8 to generate syndrome bits S1, S2 and S3. In the embodiment shown in FIG. 3, XOR gates 52–66 are connected to provide the logical relationships between bits B2–B8 and bits S1–S3 which are defined in Equations 7a, 7b and 7c. Bits S1, S2 and S3 are combined by NOR gate 68 to produce a syndrome check (SC) signal which is a "1" only when S1, S2 and S3 are all "0". In other words, the SC signal is "1" only if the syndrome requirements are all met by received vector B.

Parity check circuit 40 contains a single XOR gate 70 which receives bits B1 and B2 from shift register 34. The output of XOR gate 70 is a parity check (PC) signal which is a "1" only if bits B1 and B2 are unequal.

Error detect circuit 42 receives the WC, SC and PC signals from weight check circuit 36, syndrome check circuit 38 and parity check circuit 40, respectively. Error detect circuit 42 is, in FIG. 3, a single NAND gate 72 which produces an ERROR DETECT signal which is a "1" (indicating the presence of an error) whenever the WC, SC or PC signals are "0". If all three signals are "1", the ERROR DETECT signal at the output of NAND gate 72 is a "0", thus indicating the absence of an error.

The preferred embodiment shown in FIG. 3 provides error detection capabilities only. No attempt is made in that embodiment to utilize the weight, syndrome and parity check information to provide error correction. In other embodiments of the present invention, however, all single errors in received vector B are corrected based upon the weight, syndrome and parity information.

Figure 4:
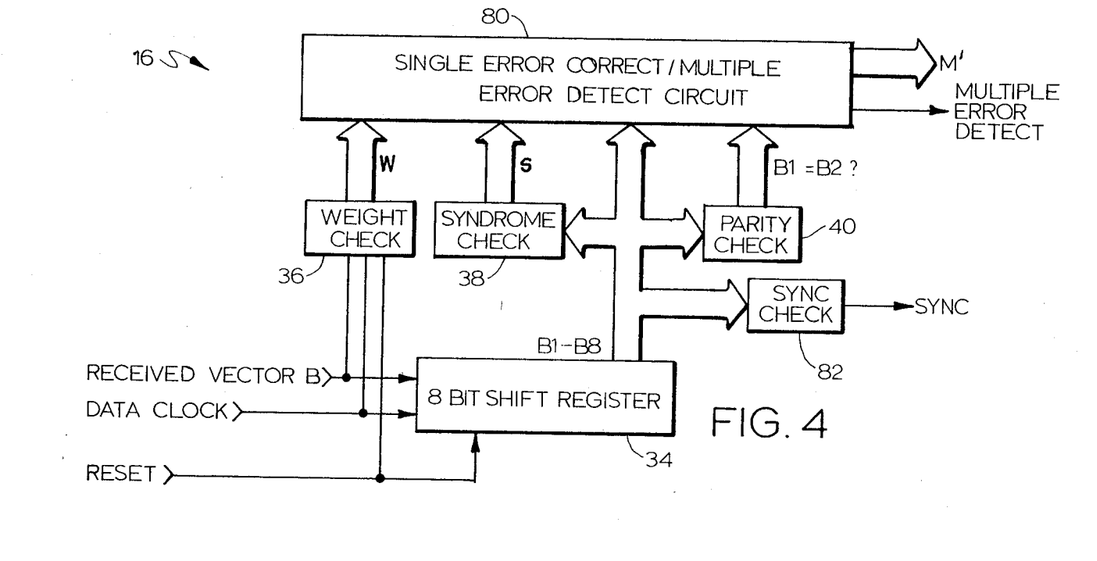
FIG. 4 is another preferred embodiment of the decoder of the system of FIG. 1.

FIG. 4 shows another embodiment of the present invention in which all single errors in the received vector B are corrected, all double errors are detected, and most errors of multiciplicity greater than 2 are also detected. In addition, decoder 16 shown in FIG. 4 includes sync detect circuit 82 which produces a sync signal indicating the presence of a synchronization pattern from transmitter 12. Sync detect circuit 82 is not required for error-correction but rather is an additional feature which could also be included, for example, in the preferred embodiment of FIG. 3.

The embodiment of decoder 16 shown in FIG. 4 is similar to that shown in FIG. 3, and similar elements have been designated with similar reference characters. Decoder 16 includes a shift register 34, weight check circuit 36, syndrome check circuit 38, parity check circuit 40, single error correct/multiple error detect circuit 80, and sync detect circuit 82.

In FIG. 4, received vector B is clocked into eight-bit shift register 34 together with the data clock signal from receiver 14. The RESET signal resets shifts register 34, as well as weight check circuit 36 prior to each new received vector B. Once loaded, the eight outputs of shift register 34 represent bits B1 through B8 of received vector B. Some or all of these bits are provided to syndrome check circuit 38, parity check circuit 40, single error correct/multiple error detect circuit 80, and sync detect circuit 82.

Weight check circuit 36 provides a weight value W to circuit 80 based upon the number of "1's" contained in received vector B. Syndrome check circuit 38 provides the syndrome vector S to circuit 80. Parity check circuit 40 provides an indication to circuit 80 of whether bits B1 and B2 are equal.

Table 2 shows the action taken by single error correct/multiple error detect circuit 80 in response to the various combinations of weight, syndrome and parity. Circuit 80 contains the digital logic (e.g. in the form of discrete logic gates or in the form of a stored program of a microcomputer) which provides the response specified in Table 2 for any given combination of weight W, syndrome S, and parity.

TABLE 2

| WEIGHT (W) | SYN-DROME (S) | PARITY (B1=B2) | ACTION BY CIRCUIT 80 |
|---|---|---|---|
| W=4 | S=000 | B1≠B2 | Assume Code Vector B is correct. |
| W=3 or 5 | S=000 | B1≠B2 | Detect a Multiple Error |
| W=3 or 5 | S=000 | B1=B2 | Correct B1 |
| W=3 or 5 | S=001 | B1≠B2 | Detect a Multiple Error |
| W=3 or 5 | S=001 | B1=B2 | Correct B2 |
| W=3 or 5 | S>001 | B1≠B2 | Correct Bi, where S=i |
| W=3 or 5 | S>001 | B1=B2 | Detect a Multiple Error |
| W=4 | S≠000 | Don't Care | Detect a Multiple Error |
| W=4 | Don't Care | B1=B2 | Detect a Multiple Error |
| W≠3,4 or 5 | Don't Care | Don't Care | Detect a Multiple Error |

In the embodiment of the present invention in which the weight, syndrome, and parity information is used to provide the responses listed in Table 2, circuit 80 corrects all single errors in vector B before providing message M' based on vector B. All double errors are detected by circuit 80 and a MULTIPLE ERROR DETECT signal is produced. In addition, circuit 80 detects most higher multiplicity errors and produces the MULTIPLE ERROR DETECT signal.

When single error correction as well as detection is provided, as in FIG. 4, there are two types of higher order multiple errors which are undetected by decoder 16. First, as described previously, decoder 16 is unable to detect a quadruple, sextuple or octuple error which occurs such that the number of "1's" incorrectly received as "0's" equals the number of "0's" incorrectly received as "1's" and the result is one of the eight possible code vectors listed in Table 1. Second, when single error correction is provided, decoder 16 cannot detect a triple, quintuple or septuple error in which the difference between the number of "1's" incorrectly received as "0's", and the number of "0's" incorrectly received as "1's" is exactly one.

In other words, the type of noise which creates an undetected error must corrupt at least three of eight bits in a code word. In addition, the noise must corrupt both "0's" and "1's" in roughly equal porportions within the received vector B.

For communication systems in which bursts of errors tend not to corrupt both "1's" and "0's" in equal proportion, the present invention is an extremely efficient way to detect virtually all likely error patterns. Even in those communication systems where errors may corrupt "1's" and "0's" in roughly equal proportion, the present invention represents a significant improvement over the prior art (8, 4) Hamming code, which detects no error of multiplicity greater than two. Although the present invention utilizes an eight-bit code vector containing three message bits (as opposed to four message bits used in the Hamming code) the percentage decrease in efficiency resulting from one less message bit in each vector is much less than the percentage increase in detection capability achieved with the present invention.

In addition to the error detection and correction capabilities achieved using the fixed weight code shown in Table 1, other advantages are achieved as well. In particular, the property that no code vector C has the same symbol consecutively repeated more than two times means that transmissions containing long strings of "0's" or long strings of "1's" can be used as receiver synchronization signals. The probability of such sychronization signals being misinterpreted by decoder 16 as a code vector is very small. As a result, one-way synchronization from transmitter 12 to receiver 14 is possible. In the preferred embodiment of the present invention shown in FIG. 4, the incoming bits of the received vector B are also checked by sync detect circuit 82 to see whether the received vector B is in fact a receiver synchronization signal.

In other preferred embodiments of the present invention, decoder 16 is a programmed microcomputer which performs the weight, syndrome, parity check, single error correct, multiple error detect, and sync detect operations based upon a stored program, rather than by means of discrete logic like that shown in FIG. 3. The computational capabilities of the microcomputer are also particularly well-suited for providing single error correction based upon the weight, syndrome and parity information. The use of the microcomputer as decoder 16 is particularly advantageous in systems in which the microcomputer also is required to perform further processing of message bits M1', M2' and M3' or is used to control peripheral equipment based upon the received messages M'.

Encoder 10 is also, in some preferred embodiments, a programmed microcomputer. This is advantageous where the microcomputer is used for other signal processing or control tasks as well, since the number of steps required by the microcomputer to convert message M to code vector C is rather small.

The fixed weight of 4 and the absence of long strings of "1's" and "0's" in the code of the present invention provides another important advantage when transmitter 12 and receiver 14 are an FSK system in which the transmitter includes a phase locked loop which is locked to the 60 Hz power line carrier frequency and which synthesizes higher frequency signals, including the FSK signal. This FSK signal has a frequency which is higher than a center or reference frequency to indicate a "1" and has a frequency which is lower than the center frequency to indicate a "0". The phase locked loop includes a voltage controlled oscillator which generates the FSK signal as a function of a control voltage. With the present invention, equal numbers of "1's" and "0's" are generated, so that the average control voltage to the voltage controlled oscillator is constant regardless of the particular messages M which are to be transmitted. As a result, the content of messages M does not tend to pull the phase locked loop out of lock, since the code vector C which is transmitted always contains equal numbers of "1's" and "0's".

The fixed weight code illustrated in Table 1 represents one preferred embodiment of a fixed weight code of the present invention derived from the message bits M1-M3. In accordance with the present invention, other fixed weight codes consisting of eight-bit code vectors C all of which have a weight of 4 are possible. For example, other permutations of bits C1-C8 provide fixed weight codes having weights of 4 which contain the same bits, but in somewhat different order. When different fixed weight codes are used, the format of the permissible code vectors and the arrangement of the check bits is somewhat altered. As a result, the syndrome calculation must, of course, be altered to accommodate the differences in the code from that of Table 1. In addition, the error correction decoding relationships shown in Table 2 must also be altered to accommodate the differences in fixed weight code. Despite these differences, decoder 16 still detects errors and, in some embodiments, corrects errors based upon a weight check, a syndrome check and a parity check of the received vector B.

Although the present invention has been described with reference to preferred embodiments, workers skilled in the art will recognize that changes may be made in form and detail without departing from the spirit and scope of the invention.

What is claimed is:

1. A system for digital data communication between a first and a second location, the system comprising:
    means at the first location for converting a three-bit input word to an eight-bit code vector, wherein the eight bits of the code vector each have a different combination of first and second binary state values for each of eight possible combinations of first and second binary state values for each of the three bits of the input word, wherein the code vector has a fixed weight of first binary symbols regardless of the input word and wherein the code vector is so constituted that combination in a selected manner with a matrix characteristic of the selected code provides a syndrome;
    means for transmitting the code vector from the first to the second location;
    means at the second location for receiving a code vector in response to the transmitting means;
    means at the second location for checking the weight of first binary symbols of the code vector received;
    means at the second location for combining selected bits of the code vector received to produce a syndrome which has a predetermined value if the code vector received contains no errors; and
    means at the second location for providing an error detect signal as a function of the checked weight and the syndrome of the code vector received.

2. The system of claim 1 and further comprising:
    means at the second location for deriving a three-bit output word from the code vector received.

3. The system of claim 1 and further comprising:
    means at the second location for checking parity of a predetermined pair of bits of the code vector received which are unequal if the code vector received contains no errors; and
    wherein the means for providing an error detect signal provides the error detect signal as a function of the weight, syndrome and parity of the code vector received.

4. The system of claim 3 and further comprising:
    means at the second location for correcting one bit of the code vector received if the weight, syndrome and parity indicate that the code vector contains a single error and that the one bit is in error.

5. The system of claim 1 wherein the code vector contains the same binary symbol consecutively repeated no more than twice.

6. The system of claim 1 and further comprising:
    means for transmitting a synchronization pattern from the first to the second location, the synchronization pattern containing a string of binary bits which do not form one of the eight possible combinations of bits of the code vector;
    means at the second location for checking the bits received to determine the presence of the synchronization pattern.

7. The system of claim 1 wherein the code vector satisfies the matrix product $CH^t = 0$, where C is the code vector, H is the check matrix used in the Hamming (8, 4) code, and addition is modulo 2.

8. A digital data communication system comprising:
    encoder means for converting a three-bit input word M containing three binary message bits M1, M2 and M3 to a code vector C containing binary code bits C1, C2, C3, C4, C5, C6, C7 and C8, wherein the code vector C contains a predetermined weight of binary "1's" regardless of the binary states of message bits M1, M2 and M3;
    syndrome producing means wherein C5+C6+C7+C8=0, C3+C4+C7+C8=0, C2+C4+C6+C8=0, and C1+C2+C3+C4+C5+C6+C7+C8=0;
    parity producing means wherein a predetermined pair of code bits have opposite binary states;
    transmitter means for transmitting the code vector C;
    receiver means for receiving, in response to the transmitting of code vector C, a received vector B containing binary bits B1, B2, B3, B4, B5, B6, B7 and B8 which are equal to binary code bits C1, C2, C3, C4, C5, C6, C7 and C8, respectively, if B=C;
    decoder means, through logic gate correctional system, for checking the weight of the received logic vector, determining a syndrome of the received vector B by combining selected bits of the received vector B and wherein the logic gate correctional system decoder means provides an error detect signal as a function of the weight and the syndrome of the received vector B; and
    the decoder means also for converting the received vector B to a three-bit output word M' containing message bits M1', M2' and M3' which are equal to message bits M1, M2 and M3 if B=C.

9. The data communication system of claim 8 wherein the decoder means checks parity of a predetermined pair of bits of the received vector B by compairing binary values of each bit, and wherein the decoder means provides the error detect signal as a function of the weight, the syndrome, and the parity of the received vector B.

10. The data communication system of claim 9 wherein the decoder means applies the weight, the syndrome and parity check values to inputs of correctional logic gate system to correct a selected bit of received vector B.

11. The data communication system of claim 10 wherein transmission errors are corrected by the decoder means correcting the selected bit through the correctional logic gate system if the weight, syndrome and parity indicate the presence of a single error in vector B and that the selected bit is the cause of the single error, and by the decoder means through the correctional logic gate system providing the error detect signal if the weight, syndrome and parity indicate the presence of multiple errors in vector B.

12. The data communication system of claim 9 wherein C1=M1, C2=M1, C3=M2, C4=M2, C5=M3, C6=M3, C7=(M2⊕M3)⊕M1, and C8=(M2⊕M3)⊕M1.

13. The data communication system of claim 12 wherein the syndrome determined by the decoder means is a three-bit vector S=S3 S2 S1, where S3=B5⊕B6⊕B7⊕B8, S2=B3⊕B4⊕B7⊕B8, and S1=B2⊕B4⊕B6⊕B8.

14. The data communication system of claim 13 wherein S=000 if received vector B=C.

15. The data communication system of claim 9 wherein the parity check is made through having logic gates determine if the predetermined pair of bits have opposite binary values, which will occur if B=C.

16. The data communication system of claim 15 wherein one bit of the predetermined pair of bits equals a selected bit of the message bits and the other bit equals the complement of the selected bit if B=C.

17. The data communication system of claim 8 wherein the predetermined weight is four.

18. The data communication system of claim 17 wherein the code vector C contains the same binary symbol consecutively repeated no more than twice.

19. The system of claim 8 wherein the code vector satisfies the matrix $CH^t=0$, where C is the code vector, H is the check matrix used in the Hamming (8, 4) code and addition is modulo 2.

20. A method of data communication comprising:
converting an input word M including three binary message bits M1, M2 and M3 to a code vector C containing binary code bits C1, C2, C3, C4, C5, C6, C7 and C8, the code vector C having a predetermined weight of one binary value regardless of the input word; the code vector having a predetermined syndrome and the code vector having a predetermined pair of parity check bits;
transmitting the code vector C;
receiving in response to transmitting code vector C, a vector B containing binary bits B1, B2, B3, B4, B5, B6, B7 and B8, where received vector B is equal to code vector C if data transmission has occurred without error;
checking weight of vector B to determine if vector B has the predetermined weight;
checking syndrome of vector B by combining selected bits of vector B to produce a syndrome vector S which should have a predetermined value if B=C;
checking parity of a predetermined pair of bits of vector B which should have a predetermined relationship if B=C;
collecting by logic gate means the results of checking the weight, the syndrome and the parity for thereby determining by logic gate means if B=C;
providing a signal, if B≠C, indicating that vector B is not equal to vector C as a function of the checked weight, syndrome and parity; and
converting the vector B to a three-bit output word M' containing binary message bits M1', M2' and M3', where M=M' if B=C.

21. The method of claim 20 wherein C1=M2, C2=M1, C3=M2, C4=M2, C5=M3, C6=M3, C7=(M2⊕M3)⊕M1, and C8=(M2⊕M3)⊕M1.

22. The method of claim 21 wherein the syndrome vector S=S3 S2 S1, and wherein S3=B5⊕B6⊕B7⊕B8=0, S2=B3⊕B4⊕B7⊕B8=0, and S1=B2⊕B4⊕B6⊕B8=0, if B=C.

23. The method of claim 22 wherein the predetermined pair of bits are B1 and B2 and wherein B1 does not equal B2 if B=C.

24. The method of claim 23 wherein the predetermined weight of a selected binary symbol is four.

25. The method of claim 20 and further comprising: correcting one bit of vector B prior to converting vector B to output word M' by use of a logic gate correction system determining that the weight, syndrome and parity indicate that B does not equal C, that B contains only one error, and that the one bit is in error.

26. The method of claim 25 wherein providing the signal indicating that vector B is not equal to vector C is based upon checked weight, syndrome and parity which indicate the presence of multiple errors in vector B.

27. A method of data communication comprising:
providing a three-bit input word;
converting the input word to an eight-bit code vector, wherein each bit of the code vector has a first or a second binary state value, wherein a different code vector is provided for each possible combination of the three bits of the input words, wherein each different code vector has a fixed weight of first binary values, and wherein the code vector is so constituted that combination in a selected manner with a matrix characteristic of the selected code provides a syndrome;
transmitting the code vector from a first to a second location;
receiving, in response to the transmitted code vector, a received vector;
checking the weight of first binary symbols in the received vector at the second location by counting them to determine if an error is present in the received vector;
combining selected bits of the received vector to produce a syndrome which has a predetermined value if the received vector contains no errors.

28. The method of claim 27 and further comprising: deriving a three-bit output word from the code vector received.

29. The method of claim 27 and further comprising: checking the weight of the received logic vector, and determining a syndrome of the received vector B by combining selected bits of the received vector B through decoder means; and
providing an error detect signal indicative of presence of an error in the logic vector received as a function of the weight and syndrome of the logic vector received.

30. The method of claim 27 and further comprising: checking parity of a predetermined pair of bits of the code vector received which are unequal if the code vector received contains no errors.

31. The method of claim 30 and further comprising: providing an error detect signal indicative of presence of an error in the code vector received as a function of the weight, the syndrome, and the parity of the code vector received.

32. The method of claim 31 and further comprising: collecting in a logic gate correction system the results of the weight, the syndrome and the parity check; correcting one bit of the code vector received if the logic gate correction system determines from the weight, the syndrome and the parity that the code vector received contains a single error, and that the one bit is in error; and
providing a signal indicative of a multiple error in the code vector received if the logic gate correction system determines from the weight, the syndrome and the parity that the code vector contains more than one bit which is erroneous.

33. The method of claim 31 wherein no combination of two of the different code vectors in succession results in the same binary symbol being consecutively repeated more than twice.

34. The method of claim 27 wherein in each of the different code vectors the same binary symbol is consecutively repeated no more than twice.

35. A transmitter for encoded digital data communication, the transmitter comprising:
    means for converting a three-bit input word to an eight-bit code vector, wherein the eight bits of the code vector have a different combination of first and second binary values for each of eight possible combinations of first and second binary values for the three bits of the input word; and
    means for fixing the weight of the code vector to a predetermined value regardless of the input word;
    means for producing a syndrome which produces a fixed value when combined with the code vector;
    means for generating a pair of parity bits within the code vector; and means for transmitting the eight-bit code vector.

36. The transmitter of claim 35 wherein the code vector contains the same binary symbol consecutively repeated no more than twice.

37. The transmitter of claim 36 wherein the fixed weight is four.

38. The transmitter of claim 35 wherein the code vector contains binary code bits C1, C2, C3, C4, C5, C6, C7 and C8, and wherein:
    $C5 \oplus C6 \oplus C7 \oplus C8 = 0$
    $C3 \oplus C4 \oplus C7 \oplus C8 = 0$
    $C2 \oplus C4 \oplus C6 \oplus C8 = 0$.

39. The transmitter of claim 38 wherein: $C1 \oplus C2 \oplus C3 \oplus C4 \oplus C5 \oplus C6 \oplus C7 \oplus C8 = 0$.

40. The transmitter of claim 38 wherein: $C1 \oplus C2 = 1$.

41. The transmitter of claim 38 wherein the three-bit input word has binary message bits M1, M2 and M3, and wherein $C1 = M1$, $C2 = M1$, $C3 = M2$, $C4 = M2$, $C5 = M3$, $C6 = M3$, $C7 = (M2 \oplus M3) \oplus M1$, and $C8 = (M2 \oplus M3) \oplus M1$.

42. A digital data transmitter having structure for providing error detection and correction comprising:
    encoder means for converting a three-bit input word M containing three binary message bits M1, M2 and M3 to a code vector C containing binary code bits C1, C2, C3, C4, C5, C6, C7 and C8, wherein the code vector C contains a predetermined weight of binary "1's" regardless of the binary states of message bits M1, M2 and M3;
    syndrome producing means for the code vector which produces a fixed value when combined with the code vector;
    parity check means for generating a pair of bits with opposite binary values within the code vector; and
    transmitter means for transmitting the code vector C.

43. The data transmitter of claim 42 wherein $C1 = M1$, $C2 = M1$, $C3 = M2$, $C4 = M2$, $C5 = M3$, $C6 = M3$, $C7 = (M2 \oplus M3) \oplus M1$, and $C8 = (M2 \oplus M3) \oplus M1$.

44. The data transmitter of claim 42 wherein $C5 \oplus C6 \oplus C7 \oplus C8 = 0$, $C3 \oplus C4 \oplus C7 \oplus C8 = 0$, and $C2 \oplus C4 \oplus C6 \oplus C8 = 0$.

45. The data transmitter of claim 44 wherein $C1 \oplus C2 = 1$.

46. The data transmitter of claim 42 wherein the predetermined weight is four.

47. The data transmitter of claim 46 wherein the code vector C contains the same binary symbol consecutively repeated no more than twice.

48. A receiver of encoded digital data particularly adapted for decoding digital data, said receiver comprising:
    means for receiving a vector B containing binary bits B1, B2, B3, B4, B5, B6, B7 and B8;
    means for checking weight of vector B to determine if vector B has a predetermined weight of one binary values;
    means for checking syndrome of vector B by combining selected bits of vector B to produce a syndrome vector S which should have a predetermined value;
    means for checking parity of a predetermined pair of bits of vector B which should have a predetermined relationship;
    means for providing a signal indicating that vector B contains an error as a function of the checked weight, syndrome and parity; and
    means for converting the vector B to a three-bit output word M' containing binary message bits M1', M2' and M3'.

49. The receiver of claim 48 wherein the syndrome vector S=S3 S2 S1, and wherein
    $S3 = B5 \oplus B6 \oplus B7 \oplus B8 = 0$,
    $S2 = B3 \oplus B4 \oplus B7 \oplus B8 = 0$, and
    $S1 = B2 \oplus B4 \oplus B6 \oplus B8 = 0$, if B contains no errors.

50. The receiver of claim 48 wherein the predetermined pair of bits are B1 and B2 and wherein B1 does not equal B2 if B contains no errors.

51. The receiver of claim 48 wherein the predetermined weight of a selected binary symbol is four.

52. The receiver of claim 48 and further comprising:
    means for correcting one bit of vector B prior to converting vector B to output word M' if the weight, syndrome and parity indicate that B contains only one error, and that the one bit is in error.

53. A receiver for receiving an eight-bit code vector and converting the code vector to a three-bit output word, the receiver comprising:
    means for receiving the code vector;
    means for checking a weight of first binary state values in the code vector received to determined if an error is present in the code vector as received, wherein an error is present if the weight is not a predetermined value;
    means for deriving a three-bit output word from the code vector received;
    means for combining selected bits of the code vector received to produce a syndrome which has a predetermined value if the code vector received contains no errors; and
    means for providing an error detect signal as a function of the checked weight and the syndrome of the code vector received.

54. The receiver of claim 53 and further comprising:
    means for checking parity of a predetermined pair of bits of the code vector received which are unequal if the code vector received contains no errors; and wherein the means for providing an error detect signal provides the error detect signal as a function of the weight, syndrome and parity of the code vector received.

55. The receiver of claim 54 and further comprising:
    means for correcting one bit of the code vector received if the weight, syndrome and parity indicate that the code vector contains a single error and that the one bit is in error.

56. An encoded digital data receiver system comprising:

transmitter means for transmitting a code vector C;

receiver means for receiving, in response to transmitting code vector C, a received vector B containing binary bits B1, B2, B3, B4, B5, B6, B7 and B8, wherein the received vector B contains a predetermined fixed weight of binary "1's" if B contains no errors; and decoder means for converting the received vector B to an output word M' containing message bits M1', M2' and M3'; and wherein the decoder means determines a syndrome of the received vector B by combining selected bits of the received vector B, and wherein the decoder means provides the error detect signal as a function of the weight, and the syndrome of the received vector B.

57. The receiver of claim 56 wherein the decoder means corrects a selected bit of the received vector B as a function of the weight and the syndrome.

58. The receiver of claim 57 wherein the decoder means corrects the selected bit if the weight, syndrome and parity indicate the presence of a single error in vector B and that the selected bit is the cause of the single error, and wherein the decoder means provides the error detect signal if the weight, syndrome and parity indicate the presence of multiple errors in vector B.

59. The receiver of claim 56 wherein the syndrome determined by the decoder means is a three-bit vector $S=S3\ S2\ S1$, where $S3=B5\oplus B6\oplus B7\oplus B8$, $S2=B3\oplus B4\oplus B7\oplus B8$, and $S1=B2\oplus B4\oplus B6\oplus B8$.

60. The receiver of claim 59 wherein $S=000$ if received vector B contains no errors.

61. The receiver of claim 56 wherein the predetermined pair of bits have opposite binary values if B contains no errors.

62. The receiver of claim 56 wherein the predetermined weight is four.

* * * * *